United States Patent
Geiger et al.

(10) Patent No.: US 6,753,270 B1
(45) Date of Patent: Jun. 22, 2004

(54) PROCESS FOR DEPOSITING A POROUS, LOW DIELECTRIC CONSTANT SILICON OXIDE FILM

(75) Inventors: Fabrice Geiger, Meylan (FR); Frederic Gaillard, Voiron (FR)

(73) Assignee: Applied Materials Inc., Santa Clara, CA (US)

( * ) Notice: Subject to any disclaimer, the term of this patent is extended or adjusted under 35 U.S.C. 154(b) by 72 days.

(21) Appl. No.: 09/632,425

(22) Filed: Aug. 4, 2000

(51) Int. Cl.$^7$ .............................................. H01L 21/31

(52) U.S. Cl. ...................... 438/780; 438/758; 438/782; 438/787; 438/789; 438/790

(58) Field of Search ................................ 438/758, 780, 438/782, 787, 789, 790

(56) References Cited

U.S. PATENT DOCUMENTS

| 4,614,021 A | 9/1986 | Hulseweh .................... 29/590 |
| 4,789,648 A | 12/1988 | Chow et al. |
| 4,851,370 A | 7/1989 | Doklan et al. |

(List continued on next page.)

FOREIGN PATENT DOCUMENTS

| EP | 822 585 | 2/1998 |
| JP | 11-097533 | 4/1999 |
| WO | WO 99/19910 | 4/1999 |

OTHER PUBLICATIONS

Kwok et al. ("Surface related phenomena in Integrated PECVD/Ozone–TEOS SACVD Processes for sub–half micron gap fill: electrostatic effects", J. Electrochem. Soc., vol. 141, No. 8, Aug. 1994).*

Fisher et al., "Global Planarization by Selective Deposition of Ozone/Teos," from VMIC conference, pp. 247–253 (1995).

Fujino et al., "Surface Modification of Base Materials for TEOS/$O_3$ Atmospheric Pressure Chemical Vapor Deposition," J. Electrochem. Soc., 139(6):1690–1692 (1992).

(List continued on next page.)

Primary Examiner—Kamand Cuneo
Assistant Examiner—Lisa Kilday
(74) Attorney, Agent, or Firm—Townsend & Townsend & Crew (57) ABSTRACT

The present invention relates to a method for providing a dielectric film having a low dielectric constant that is particularly useful as an intermetal dielectric layer. The method of the present invention deposits a porous oxide gap fill layer from a process gas of ozone and TEOS. The gap fill layer is deposited over a surface sensitive lining layer (as opposed to a non-surface sensitive layer as is commonly done in the industry) using deposition conditions that maximize the amount of carbon that is incorporated into the gap fill layer and result in a porous silicon oxide film. A typical SACVD ozone/TEOS gap fill layer has a carbon content of about 2–3 atomic percent (at. %). An SACVD ozone/TEOS gap fill layer deposited according to the present, however, has a carbon content of at least 5 at. % and preferably has a carbon content of between about 7–8 at. %. Incorporating such a high carbon content into the porous SACVD gap fill layer helps stabilize the layer so it is not susceptible to moisture absorbtion and outgassing problems as is a lower carbon content porous SACVD ozone/TEOS film. In one embodiment, the method of the present invention increases the carbon content of the SACVD ozone/TEOS layer by depositing the layer at a temperature of less than 400° C. and deposits a porous film over the surface sensitive layer by using a relatively high ozone to TEOS ratio. Silicon oxide films deposited according to the present invention have a dielectric constant of 3.2 and below and exhibit good film stability. Such films are particularly useful in sub-0.2 micron IMD applications.

25 Claims, 9 Drawing Sheets

U.S. PATENT DOCUMENTS

| | | | |
|---|---|---|---|
| 4,962,064 A | 10/1990 | Haskell et al. | |
| 4,971,655 A | 11/1990 | Stefano et al. | 156/659.1 |
| 4,992,306 A | 2/1991 | Hochberg et al. | 427/255.3 |
| 5,094,972 A | 3/1992 | Pierce et al. | |
| 5,271,972 A | 12/1993 | Kwok et al. | 427/579 |
| 5,356,722 A | 10/1994 | Nguyen et al. | 427/569 |
| 5,393,708 A | 2/1995 | Hsia et al. | |
| 5,399,389 A | 3/1995 | Hieber et al. | 427/579 |
| 5,426,076 A | 6/1995 | Moghadam | |
| 5,461,003 A | 10/1995 | Havemann et al. | |
| 5,470,802 A | 11/1995 | Gnade et al. | |
| 5,472,913 A | 12/1995 | Havemann et al. | |
| 5,484,749 A | 1/1996 | Maeda et al. | |
| 5,486,492 A | 1/1996 | Yamamoto et al. | |
| 5,488,015 A | 1/1996 | Havemann et al. | |
| 5,494,858 A | 2/1996 | Gnade et al. | |
| 5,504,042 A | 4/1996 | Cho et al. | |
| 5,525,551 A | 6/1996 | Ohta | |
| 5,536,681 A | 7/1996 | Jang et al. | |
| 5,554,570 A | 9/1996 | Maeda et al. | |
| 5,561,318 A | 10/1996 | Gnade et al. | 257/638 |
| 5,571,576 A | 11/1996 | Qian et al. | 427/574 |
| 5,656,337 A | 8/1997 | Park et al. | 427/539 |
| 5,660,895 A | 8/1997 | Lee et al. | 427/579 |
| 5,668,398 A | 9/1997 | Havemann et al. | 257/522 |
| 5,753,564 A | 5/1998 | Fukada | |
| 5,789,819 A | 8/1998 | Gnade et al. | 257/759 |
| 5,804,509 A * | 9/1998 | Cho | 438/790 |
| 6,022,802 A * | 2/2000 | Jang | 438/656 |
| 6,149,987 A | 11/2000 | Perng et al. | 427/579 |
| 6,180,507 B1 * | 1/2001 | Lan | 438/618 |

OTHER PUBLICATIONS

Fujino et al., "Dependance of Deposition Characteristics on Base Materials in TEOS and Ozone CVD at Atmospheric Pressure," *J. Electrochem. Soc.,* 138(2):550–554 (1991).

Gaillard et al., "Silicon dioxide chemical vapor deposition using silane and hydrogen peroxide," *J. Vac. Sci. Technol. B.,* 14(4):2767–2769 (1996).

Kishimoto et al., "Planarized $SiO_2$ Interlayer Formed by Two Step $O_3$/TEOS APCVD and Low Temperature Annealing," *Proceedings of the International VLSI Multilevel Interconnection Conferences,* VMIC Conference, Santa Clara, CA—Jun. 9–10, 1992, pp. 149–155 (1992).

Kwok et al., "Surface Related Phenomena in Integrated PECVD/Ozone–TEOS SACVD Processes for Sub–Half Micron Gap Fill: Electrostatic Effects," *J. Electrochem. Soc.,* 141(8):2172–2177 (1994).

Lee et al., "SACVD: A New Approach for 16Mb Dielectrics," *Semiconductor International,* pp. 116–120 (1992).

S. Mokhtari et al., "Mechanisms of Deposition of $SiO_2$ from TEOS and Related Organosilicon Compounds and Ozone," *J. Electrochem. Soc.,* 142(7):2332–2340 (1995).

Ogawa et al., "Novel ARC Optimization Methodology for KrF Exicmer Laser Lithography at Low K1 Factor," *Proceedings SPIE—The International Society for Optical Engineering, Optical/Laser Microlithography V,* eds. Cuthbert, 1674(1):362–375 (1992).

Park et al., "A Void–free Gap Fill Technology using APCVD TEOS–O3 Oxide," from DUMIC conference, pp. 183–185 (1997).

Saito et al., "Pressure–Controlled Two–Step TEOS–$O_3$ CVD Eliminating the Base Material Effect," *1995 Symposium on VLSI Technology Digest of Technical Papers,* pp. 43–44 (1995).

Sato et al., "Improvement of Gap–Filling Property of $O_3$–tetraethylorthosilicate (TEOS) Film by Ethanol Surface Treatment," *Jpn: J. Applied Physics,* vol. 32, part 2, No. 1A/B, pp. L110–L112 (1993).

* cited by examiner

PROCESS FOR DEPOSITING A POROUS, LOW DIELECTRIC CONSTANT SILICON OXIDE FILM

BACKGROUND OF THE INVENTION

The present invention relates to the formation of dielectric layers during fabrication of integrated circuits on semiconductor wafers. More particularly, the present invention relates to a method for providing a dielectric film having a low dielectric constant that is particularly useful as an intermetal dielectric layer.

One of the primary steps in the fabrication of modem semiconductor devices is the formation of a thin film on a semiconductor substrate by chemical reaction of gases. Such a deposition process is referred to as chemical vapor deposition or "CVD." Conventional thermal CVD processes supply reactive gases to the substrate surface where heat-induced chemical reactions take place to produce a desired film. The high temperatures at which some thermal CVD processes operate can damage device structures having metal layers.

One particular thermal CVD process that has been developed to deposit insulation films over metal layers at relatively low, non-damaging temperatures includes deposition of a silicon oxide layer from TEOS and ozone precursor gases. Such a TEOS/ozone silicon oxide film may be deposited under carefully controlled pressure conditions in the range of between about 100–700 Torr, and is therefore commonly referred to as a sub-atmospheric CVD (SACVD) film. The high reactivity of TEOS with ozone reduces the external energy required for a chemical reaction to take place, and thus lowers the required temperature for such SACVD processes.

Another CVD method of depositing silicon oxide layers over metal layers at relatively low temperatures includes plasma enhanced CVD (PECVD) techniques. Plasma enhanced CVD techniques promote excitation and/or dissociation of the reactant gases by the application of radio frequency (RF) energy to a reaction zone proximate the substrate surface. The high reactivity of the released species reduces the energy required for a chemical reaction to take place, and thus lowers the required temperature for such PECVD processes.

Semiconductor device geometries have dramatically decreased in size since such devices were first introduced several decades ago. As devices become smaller and integration density increases, issues that were not previously considered important by the industry are becoming of concern. With the advent of multilevel metal technology in which three, four, or more layers of metal are formed on the semiconductors, one goal of semiconductor manufacturers is lowering the dielectric constant of insulating layers such as intermetal dielectric (IMD) layers. Low dielectric constant films are particularly desirable for IMD layers to reduce the RC time delay of the interconnect metalization, to prevent cross-talk between the different levels of metalization, and to reduce device power consumption.

Figure 1:
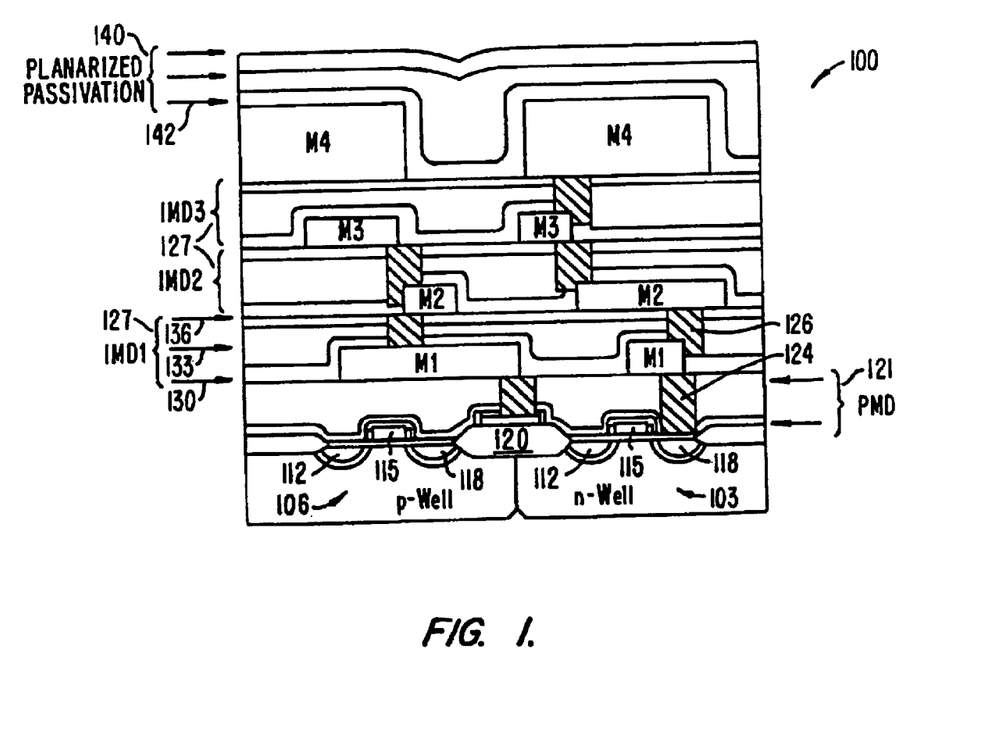
FIG. 1 is illustrative of a simplified cross-sectional view of an exemplary integrated circuit.

In order to visualize the multiple IMD layers in an integrated circuit, FIG. 1 illustrates a simplified cross-sectional view of an exemplary integrated circuit 100. As shown in FIG. 1, integrated circuit 100 includes NMOS and PMOS transistors 103 and 106, which are separated and electrically isolated from each other by a field oxide region 120. Each transistor 103 and 106 comprises a source region 112, a gate region 115 and a drain region 118.

A pre-metal dielectric (PMD) layer 121 separates transistors 103 and 106 from metal layer M1 with connections between metal layer M1 and the transistors made by contacts 124. In this exemplary integrated circuit 100, metal layer M1 is one of four metal layers, M1–M4. Each metal layer M1–M4 is separated from adjacent metal layers by respective intermetal dielectric layers 127 (IMD1, IMD2 and IMD3). IMD layers 127 may include a PECVD lining layer 130, an ozone/TEOS SACVD gap fill layer 133 and a cap layer 136. Adjacent metal layers are connected at selected openings by vias 126. Deposited over metal layer M4 are planarized passivation layers 140.

It is known that the properties of the SACVD gap fill layer 133 depend on the underlying surface onto which it is deposited. When the SACVD layer is deposited over a silicon oxide layer, such as the steam oxide or PECVD lining layer, or on the surface of a metal, the quality of the SACVD layer generally deteriorates because of surface sensitivity. The quality of such an SACVD silicon oxide layer is not as good as the quality of "steam oxide" grown on the surface of a silicon substrate by heating the substrate in the presence of steam. For example, the CVD layer is less stable than steam oxide and tends to absorb moisture over time. Such moisture absorbtion increases the dielectric constant of the layer and may lead to outgassing problems when the film is heated during subsequent processing steps.

The surface sensitivity of the SACVD layer is manifested by an increase of the wet etch rate compared to the wet etch rate of thermally grown steam oxide and a decrease of the deposition rate and a rougher surface morphology as compared to the deposition rate and surface morphology of an SACVD layer deposited directly on a silicon substrate. The wet etch rate ratio (WERR) is the ratio of the wet etch rate of an SACVD layer deposited over the PECVD lining layer to the wet etch rate of a thermally grown steam oxide. The CVD layer is typically more porous than a steam layer and tends to etch away more quickly than the steam oxide. The deposition rate w ratio (DRR) is the ratio of the deposition rate of the SACVD layer deposited over the PECVD lining layer to the deposition rate of an SACVD layer deposited directly on a bare silicon substrate. Thus, surface sensitivity is manifested by a high WERR and a low DRR.

Generally, surface sensitivity has been recognized to be undesirable in the industry. Accordingly, various techniques have been developed within the industry to reduce the sensitivity of the SACVD layer of a two-layer silicon oxide gap filling film. For example, one well-known method, developed at Applied Materials, Inc., treats the PECVD lining layer with an $N_2$ plasma excited by mixed RF frequencies (13.56 MHz and 350 KHz) prior to deposition of the SACVD layer.

Undoped silicon oxide films, such as the combination SACVD gap fill/PECVD lining layer just described, may have a dielectric constant as low as about 4.0 or 4.2. While depositing an SACVD gap fill layer over a reduced surface sensitivity PECVD lining layer is one commercially successful approach used to form IMD layers, approaches to obtain lower dielectric constant films for IMD layers 127 have been and still are being explored.

One approach to obtaining a lower dielectric constant is to incorporate fluorine in the silicon oxide film. Fluorine-doped silicon oxide films (also referred to as fluorine silicate glass or —"FSG" films) may have a dielectric constant as low as about 3.4 or 3.6. Despite this improvement, films having even lower dielectric constants (e.g., about 3.2 or less) are highly desirable for the manufacture of integrated circuits using geometries of 0.18 μm and smaller. Numerous films have been developed in attempts to meet these needs including: a spin-on glass called HSQ (hydrogen silsesqui-oxane, $HSiO_{1.5}$) and various carbon-based dielectric layers. While the above types of dielectric films are useful for some IMD applications, manufacturers are always seeking new and improved methods of depositing low-k materials for use as IMD and other types of dielectric layers.

SUMMARY OF THE INVENTION

The methods of the present invention provides such a new and improved low-k material deposition process. The process is particularly useful in the manufacture of sub-0.2 micron circuits as it can form an IMD film with a dielectric constant of about 3.2 and below. The film has good gap fill capabilities and high film stability. Furthermore, the film is deposited from constituent gases that have been used by semiconductor manufacturers to deposit other dielectric layers. Thus, the film is easily integrated into established manufacturing processes.

The method of the present invention deposits a porous oxide gap fill layer from a process gas of ozone and TEOS. The gap fill layer is deposited over a surface sensitive lining layer (as opposed to a non-surface sensitive layer as is commonly done in the industry) using deposition conditions that result in a porous film and that increase the amount of carbon that is incorporated into the gap fill layer. A typical SACVD ozone/TEOS gap fill layer has a carbon content of about 2–3 atomic percent (at. %). An ozone/TEOS gap fill layer deposited according to the present, however, has a carbon content of at least 5 at. % and preferably has a carbon content of between about 7–8 at. %. Incorporating such a high carbon content into the porous gap fill layer helps stabilize the layer so it is not susceptible to moisture absorbtion and outgassing problems as is a lower carbon content porous ozone/TEOS film. The method of the present invention increases the carbon content of the porous ozone/TEOS layer by depositing the layer at a temperature of less than 400° C.

One specific method for forming an insulation layer over a plurality of conductive lines on a substrate according to the present invention includes, forming a PECVD surface sensitive silicon oxide layer over the plurality of conductive lines and forming a porous silicon oxide layer over the surface sensitive silicon oxide layer by an SACVD process. The porous silicon oxide layer is formed from an ozone/TEOS process gas at a pressure of between 100–700 Torr. A relatively high ozone to TEOS ratio, e.g., a molar ratio of ozone to TEOS of at least 8:1, is employed to increase the surface sensitivity of the film and thereby increase the porosity of the film. During deposition, the substrate is heated to and maintained at a temperature less than or equal to about 400° C. The result is a silicon oxide layer having a low dielectric constant between 2.9 and 3.2 and good film stability.

In preferred embodiments, the process gas used for the porous gap fill layer contains a molar ratio of ozone and TEOS of between 10:1 and 20:1 and it is even more preferable that the molar ratio of ozone to TEOS is at least 11.5:1.

These and other embodiments of the present invention, as well as its advantages and features, are described in more detail in conjunction with the text below and attached figures.

DESCRIPTION OF THE SPECIFIC EMBODIMENTS

I. Introduction

Figure 2:
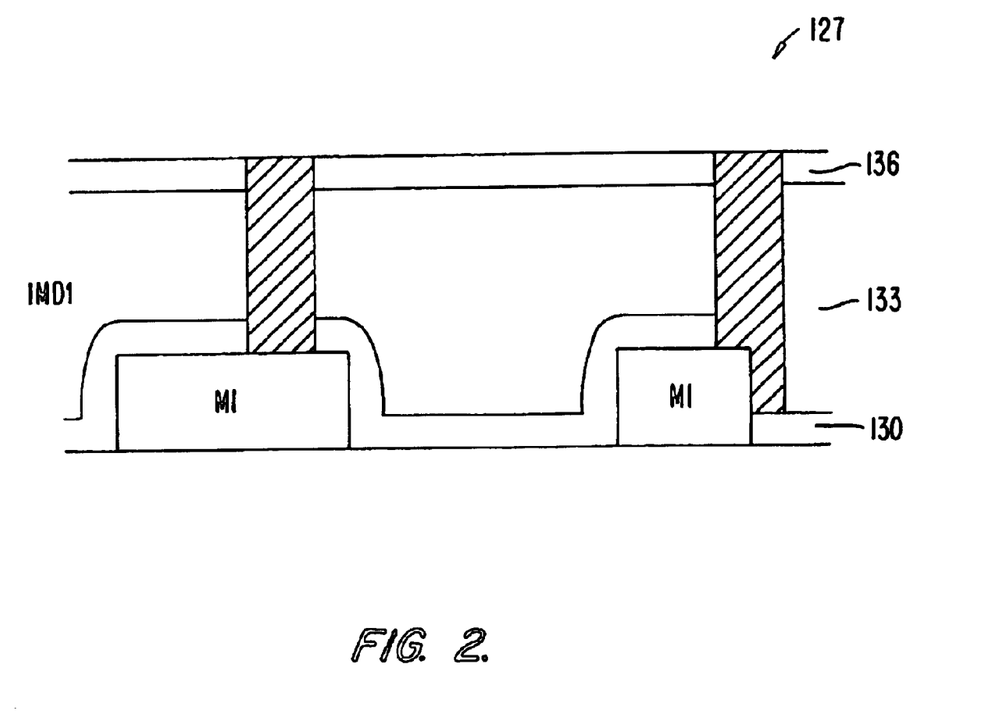
FIG. 2 is an exploded perspective of IMD1 depicted in FIG. 1.

FIG. 2 is an enlarged portion of IMD1 (layer 127) of FIG. 1. As shown in FIG. 1, layer 130 is the PECVD lining layer, layer 133 is the thicker gap fill layer, and layer 136 is the PECVD capping layer. Specific embodiments of the present invention provide a multi-step CVD process in which a thin TEOS based PECVD layer is initially deposited as a lining under layer and a thicker, porous SACVD layer is deposited on the PECVD layer as a gap fill layer. The PECVD underlayer is not treated to remove its surface sensitivity. This is opposite of conventional methods and under standard deposition conditions would result in a highly porous SACVD gap fill layer with poor film stability.

The present invention alters deposition conditions, however, so that high levels of carbon (at least 5 at. %) are incorporated into the film. Such high carbon levels serve to stabilize the film despite its porosity. Thus, the combination of deposition over a surface sensitive lining layer and incorporating a high carbon content into the gap fill layer provides a low dielectric constant gap fill layer with good film stability. Generally, silicon oxide films deposited according to the present invention have a dielectric constant of between 2.9 and 3.2.

II. Exemplary CVD System

Figure 3A:
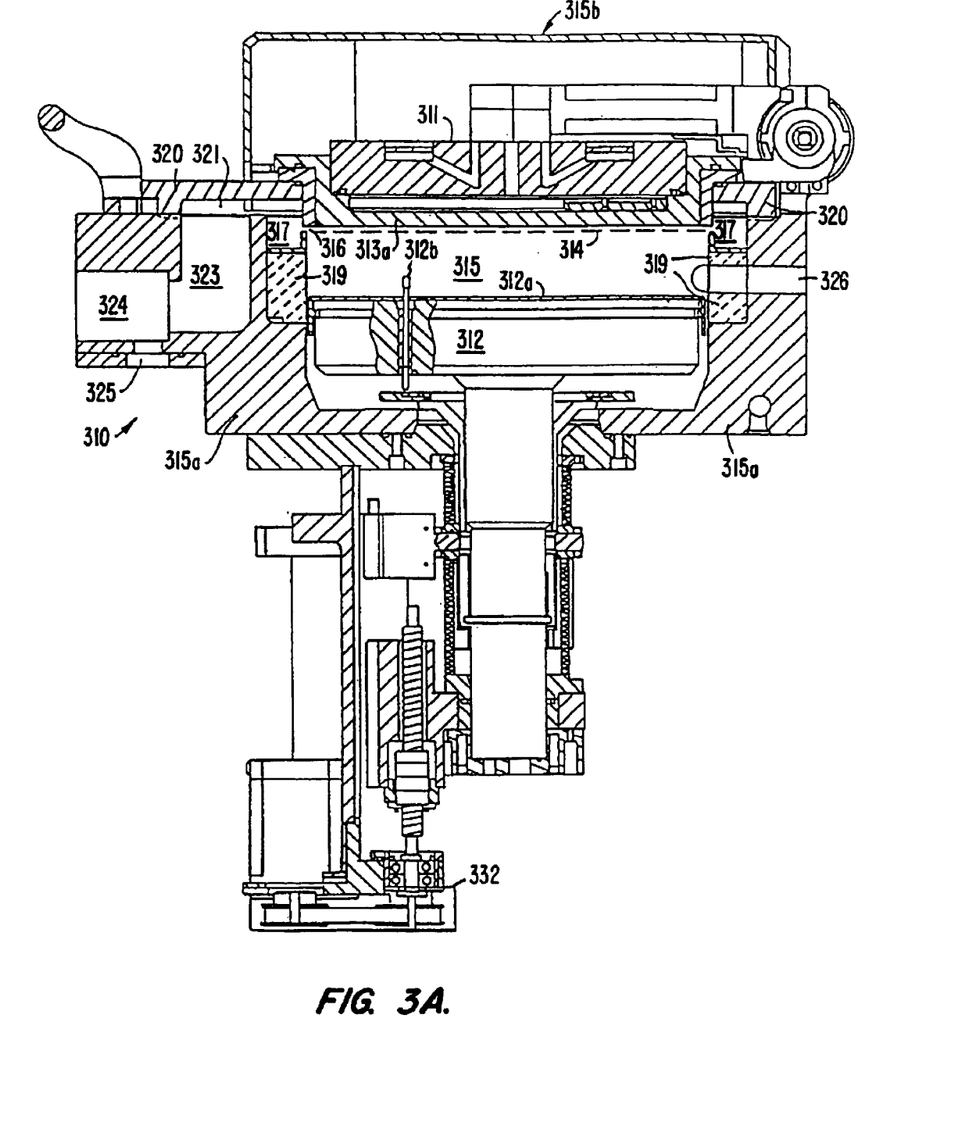
FIGS. 3A and 3B are vertical, cross-sectional views of one embodiment of a chemical vapor deposition apparatus according to the present invention.
Figure 3B:
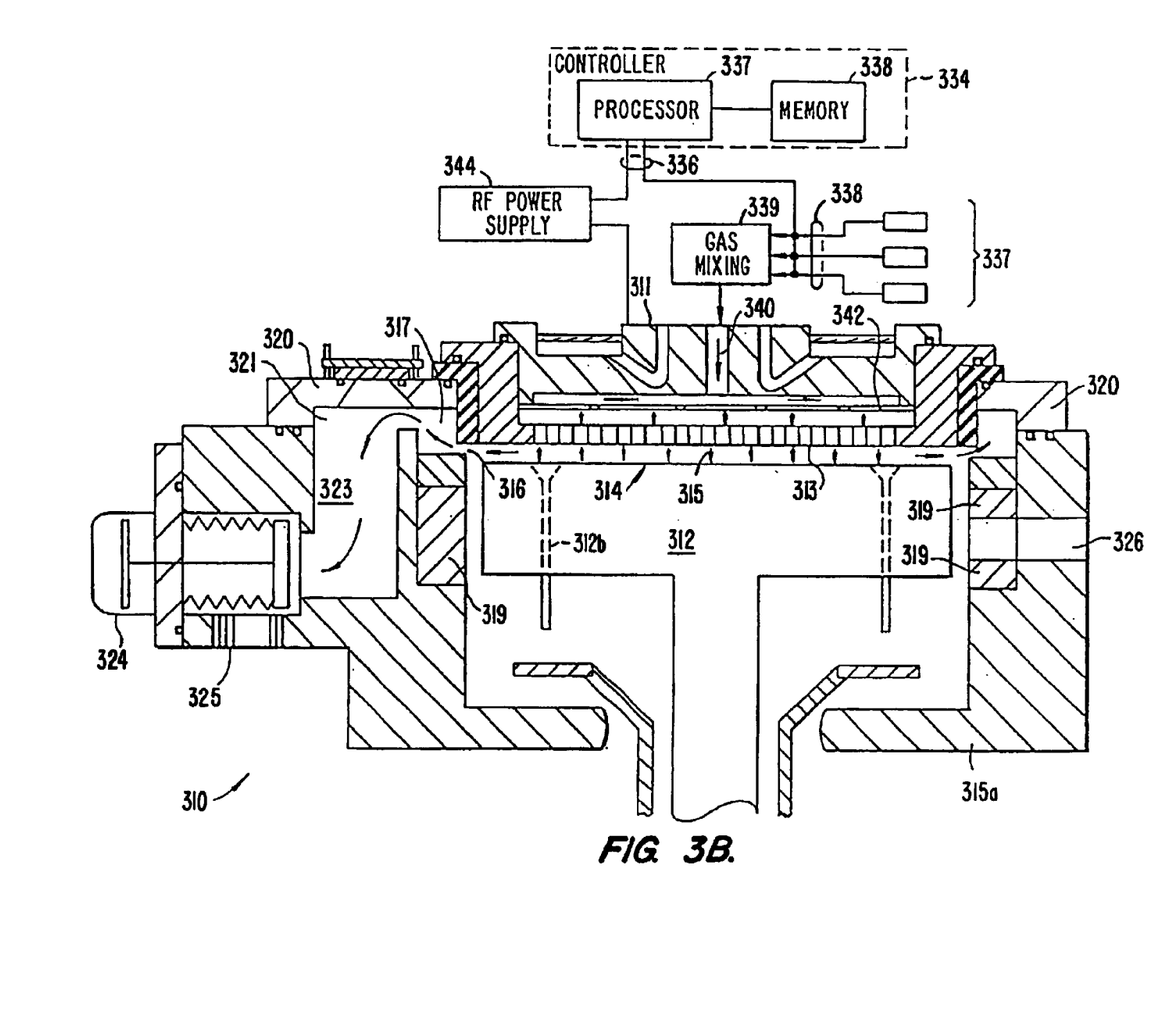
Figure 3C:
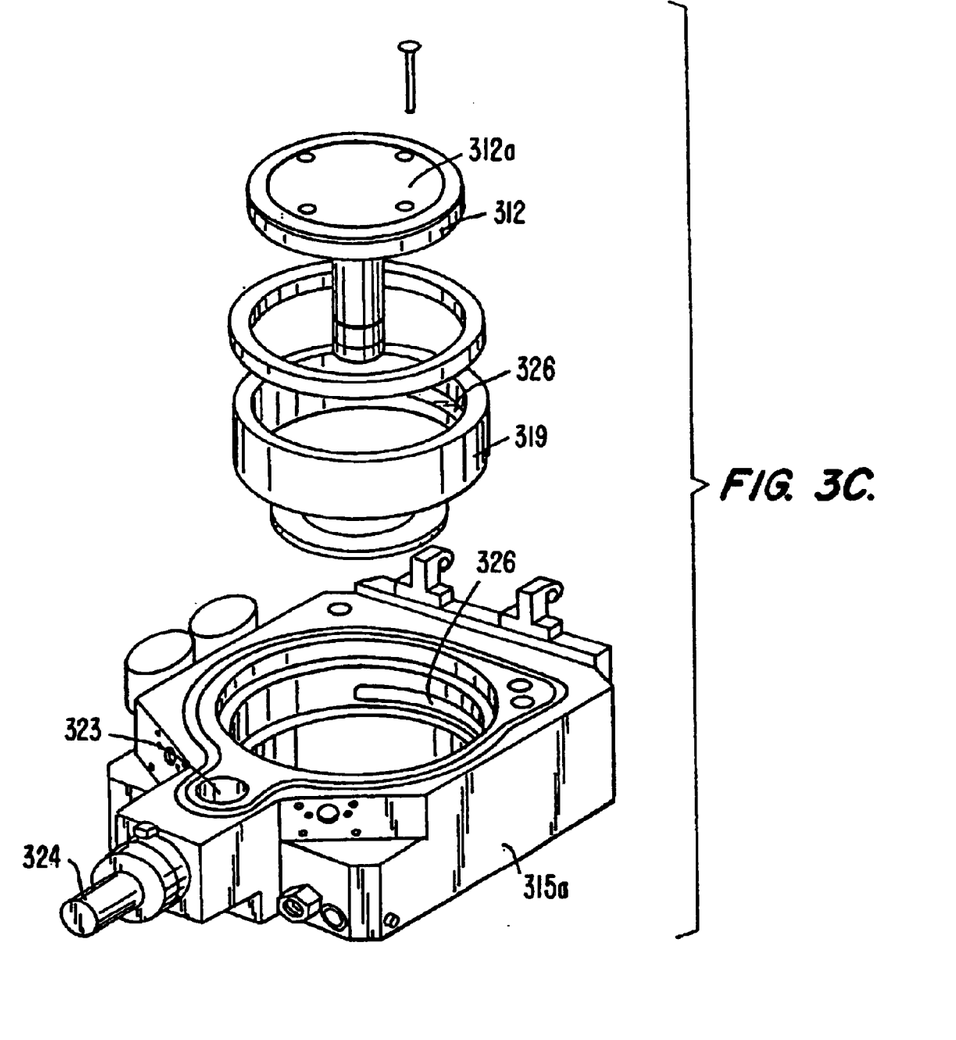
FIGS. 3C and 3D are exploded perspective views of parts of the CVD chamber depicted in FIG. 3A.
Figure 3D:
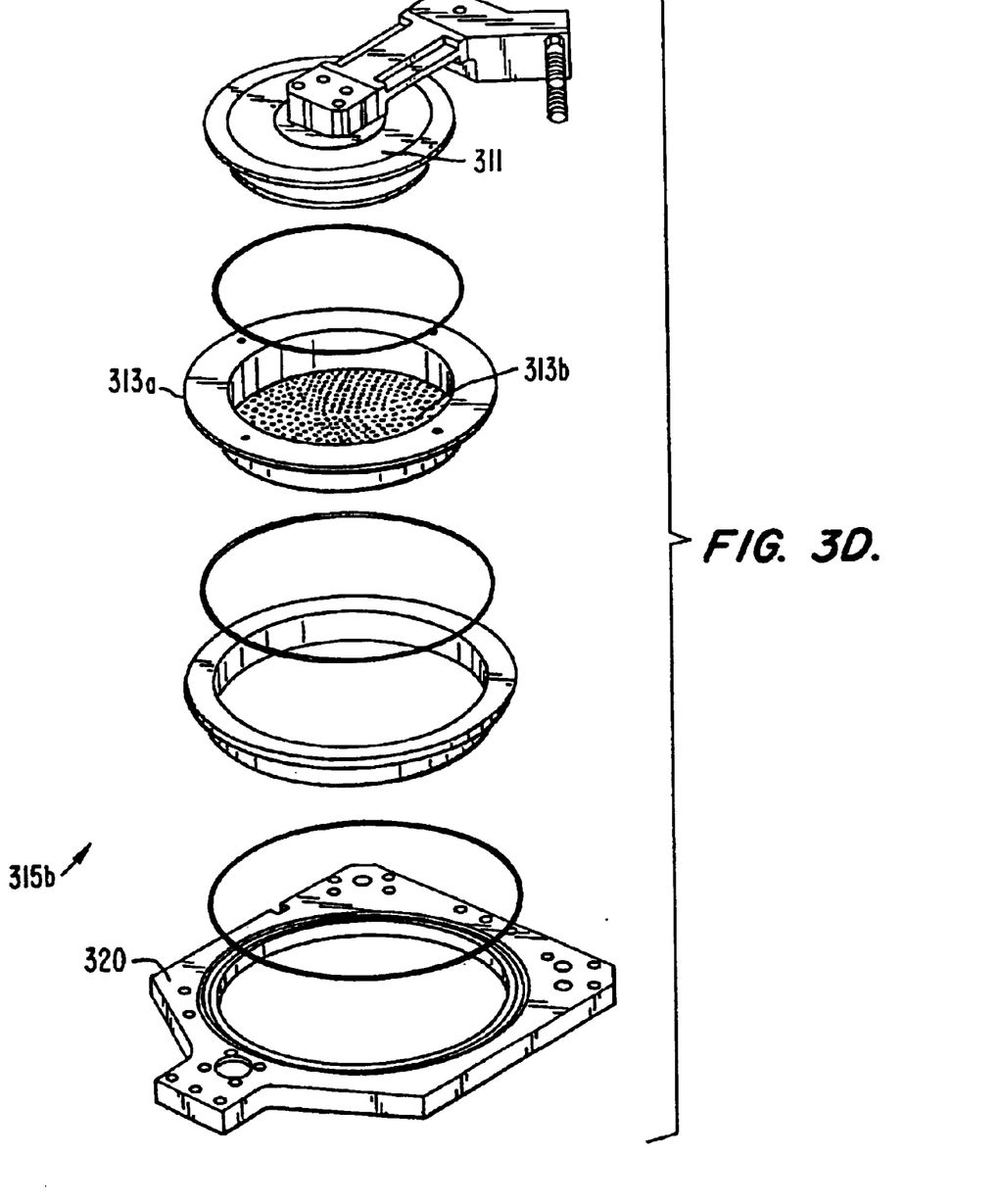

One suitable CVD apparatus in which the method of the present invention can be carried out is shown in FIGS. 3A and 3B, which are vertical, cross-sectional views of a CVD system 310, having a vacuum or processing chamber 315 that includes a chamber wall 315a and chamber lid assembly 315b. Chamber wall 315a and chamber lid assembly 315b are shown in exploded, perspective views in FIGS. 3C and 3D.

CVD system 310 contains a gas distribution manifold 311 for dispersing process gases to a substrate (not shown) that rests on a heated pedestal 312 centered within the process chamber. During processing, the substrate (e.g. a semiconductor wafer) is positioned on a flat (or slightly convex) surface 312a of pedestal 312. The pedestal can be moved controllably between a lower loading/off-loading position (depicted in FIG. 3A) and an upper processing position (indicated by dashed line 314 in FIG. 3A and shown in FIG. 3B), which is closely adjacent to manifold 311. A centerboard (not shown) includes sensors for providing information on the position of the wafers.

Deposition and carrier gases are introduced into chamber 315 through perforated holes 313b (FIG. 3D) of a conventional flat, circular gas distribution or faceplate 313a. More specifically, deposition process gases flow into the chamber through the inlet manifold 311 (indicated by arrow 340 in FIG. 3B), through a conventional perforated blocker plate 342 and then through holes 313b in gas distribution faceplate 313a.

Before reaching the manifold, deposition and carrier gases are input from gas sources 337 through gas supply lines 338 (FIG. 3B) into a mixing system 339 where they are combined and then sent to manifold 311. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in CVD system 310 can be either a thermal process or a plasma-enhanced process. In a plasma-enhanced process, an RF power supply 344 applies electrical power between the gas distribution faceplate 313a and the pedestal so as to excite the process gas mixture to form a plasma within the cylindrical region between the faceplate 313a and the pedestal. (This region will be referred to herein as the "reaction region"). Constituents of the plasma react to deposit a desired film on the surface of the semiconductor wafer supported on pedestal 312. RF power supply 344 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 315. In a thermal process, RF power supply 344 would not be utilized, and the process gas mixture thermally reacts to deposit the desired films on the surface of the semiconductor wafer supported on pedestal 312, which is resistively heated to provide thermal energy for the reaction.

During a plasma-enhanced deposition process, the plasma heats the entire process chamber 310, including the walls of the chamber body 315a surrounding the exhaust passageway 323 and the shut-off valve 324. When the plasma is not turned on or during a thermal deposition process, a hot liquid is circulated through the walls 315a of the process chamber to maintain the chamber at an elevated temperature. Fluids used to heat the chamber walls 315a include the typical fluid types, i.e., water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 316 surrounding the reaction region and into an annular exhaust plenum 317. The annular slot 316 and the plenum 317 are defined by the gap between the top of the chamber's cylindrical side wall 315a (including the upper dielectric lining 319 on the wall) and the bottom of the circular chamber lid 320. The 360° circular symmetry and uniformity of the slot orifice 316 and the plenum 317 are important to achieving a uniform flow of process gases over the wafer so as to deposit a uniform film on the wafer.

From the exhaust plenum 317, the gases flow underneath a lateral extension portion 321 of the exhaust plenum 317, past a viewing port (not shown), through a downward-extending gas passage 323, past a vacuum shut-off valve 324 (whose body is integrated with the lower chamber wall 315a), and into the exhaust outlet 325 that connects to the external vacuum pump (not shown) through a foreline (also not shown).

The wafer support platter of the pedestal 312 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 312.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference in its entirety.

A lift mechanism and motor 332 (FIG. 3A) raises and lowers the heater pedestal assembly 312 and its wafer lift pins 312b as wafers are transferred into and out of the body of the chamber by a robot blade (not shown) through an insertion/removal opening 326 in the side of the chamber 310. The motor 332 raises and lowers pedestal 312 between a processing position 314 and a lower, wafer-loading position. The motor, valves or flow controllers connected to the supply lines 338, gas delivery system, throttle valve, RF power supply 344, and chamber and substrate heating systems are all controlled by a system controller 334 (FIG. 3B) over control lines 336, of which only some are shown. Controller 334 relies on feedback from optical sensors to determine the position of movable mechanical assemblies such as the throttle valve and susceptor which are moved by appropriate motors under the control of controller 334.

In a preferred embodiment, the system controller includes a hard disk drive (memory 338), a floppy disk drive and a processor 337. The processor contains a single-board computer (SBC), analog and digital input/output boards, interface boards and stepper motor controller boards. Various parts of CVD system 310 conform to the Versa Modular European (VME) standard which defines board, card cage, and connector dimensions and types. The VME standard also defines the bus structure as having a 16-bit data bus and a 24-bit address bus.

System controller 334 controls all of the activities of the CVD machine. The system controller executes system control software, which is a computer program stored in a computer-readable medium such as a memory 338. Preferably, memory 338 is a hard disk drive, but memory 338 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 334.

Figure 3E:
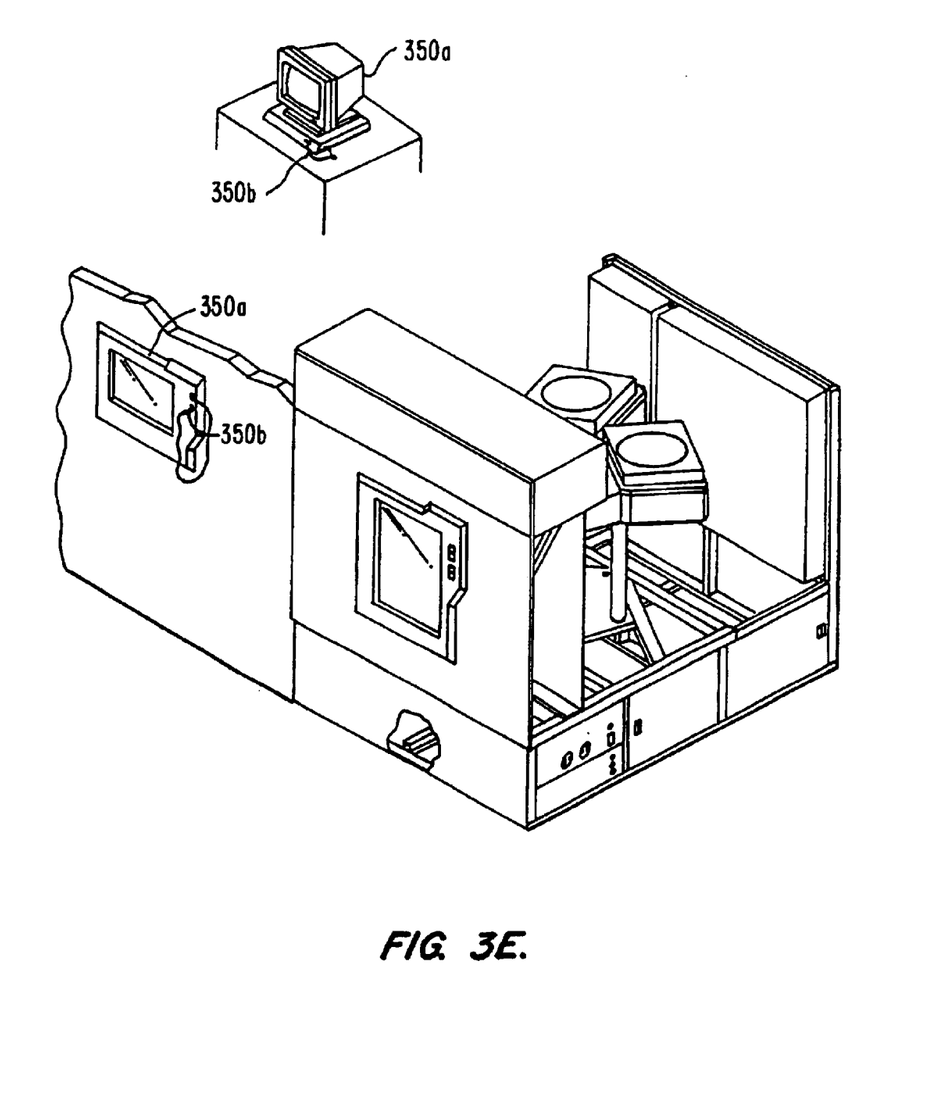
FIG. 3E is a simplified diagram of system monitor and CVD system 10 in a multi-chamber system, which may include one or more chambers.

The interface between a user and controller 334 is via a CRT monitor 350a and light pen 350b, shown in FIG. 3E, which is a simplified diagram of the system monitor and CVD system 310 in a substrate processing system, which may include one or more chambers. In the preferred embodiment two monitors 350a are used, one mounted in the clean room wall for the operators and the other behind the wall for the service technicians. The monitors 350a simultaneously display the same information, but only one light pen 350b is enabled. A light sensor in the tip of light pen 350b detects light emitted by CRT display. To select a particular screen or function, the operator touches a designated area of the display screen and pushes the button on the pen 350b. The touched area changes its highlighted color, or a new menu or screen is displayed, confirming communication between the light pen and the display screen. Other devices, such as a keyboard, mouse, or other pointing or communication device, may be used instead of or in addition to light pen 350b to allow the user to communicate with controller 334.

The process for depositing the film can be implemented using a computer program product that is executed by controller 334. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 4:
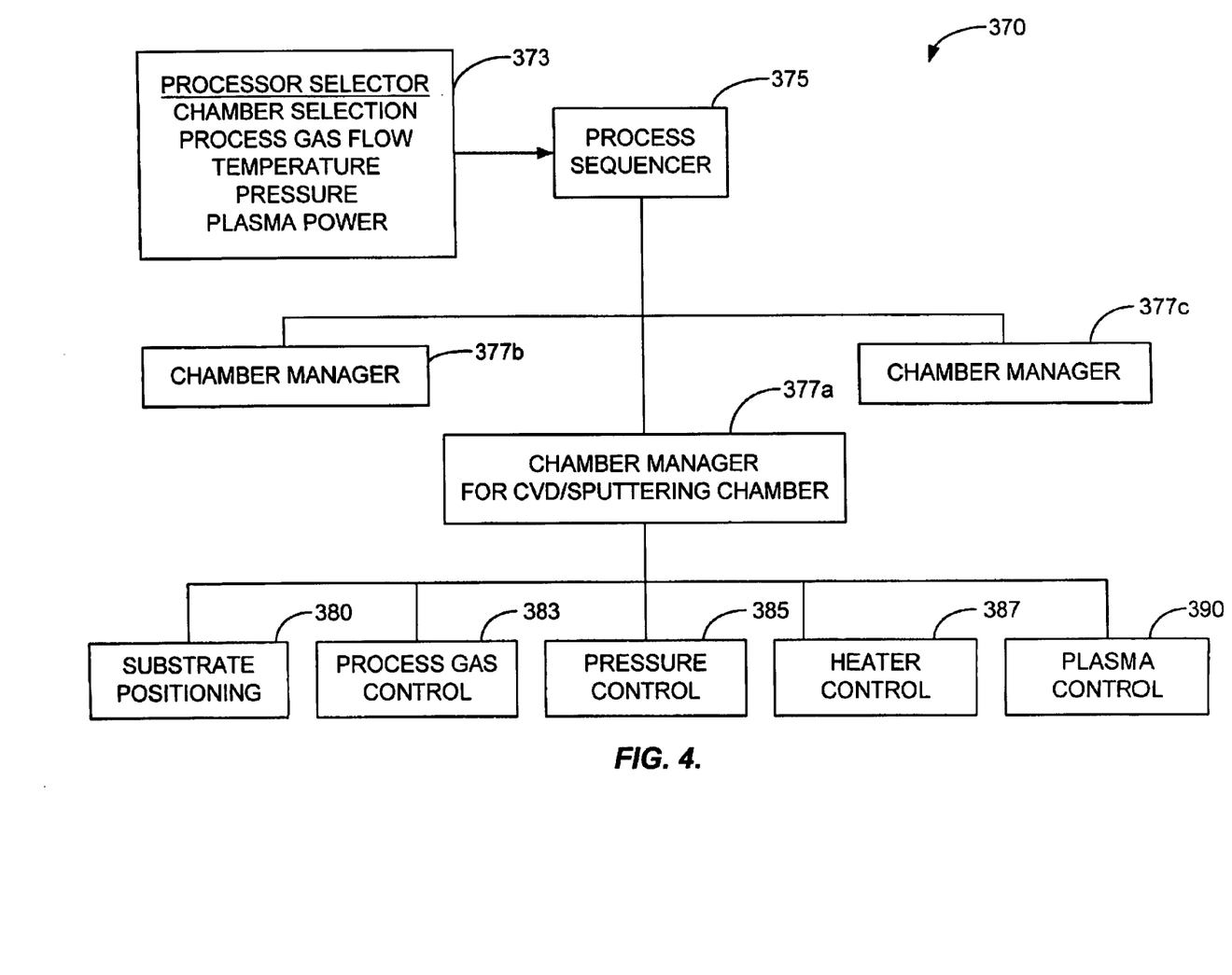
FIG. 4 shows an illustrative block diagram of the hierarchical control structure of the system control software, computer program 70, according to a specific embodiment.

FIG. 4 is an illustrative block diagram of the hierarchical control structure of the system control software, computer program 370, according to a specific embodiment. Using the light pen interface, a user enters a process set number and process chamber number into a process selector subroutine 373 in response to menus or screens displayed on the CRT monitor. The process sets are predetermined sets of process parameters necessary to carry out specified processes, and are identified by predefined set numbers. The process selector subroutine 373 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 310.

A process sequencer subroutine 375 comprises program code for accepting the identified process chamber and set of process parameters from the process selector subroutine 373, and for controlling operation of the various process chambers. Multiple users can enter process set numbers and process chamber numbers, or a user can enter multiple process set numbers and process chamber numbers, so the sequencer subroutine 375 operates to schedule the selected processes in the desired sequence. Preferably, the sequencer subroutine 375 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 375 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 375 determines which process chamber and process set combination is going to be executed next, the sequencer subroutine 375 initiates execution of the process set by passing the particular process set parameters to a chamber manager subroutine 377a–c, which controls multiple processing tasks in a process chamber 315 according to the process set determined by the sequencer subroutine 375. For example, the chamber manager subroutine 377a comprises program code for controlling sputtering and CVD process operations in the process chamber 315. The chamber manager subroutine 377 also controls execution of various chamber component subroutines that control operation of the chamber components necessary to carry out the selected process set. Examples of chamber component subroutines are substrate positioning subroutine 380, process gas control subroutine 383, pressure control subroutine 385, heater control subroutine 387, and plasma control subroutine 390. Those having ordinary skill in the art will readily recognize that other chamber control subroutines can be included depending on what processes are to be performed in the process chamber 315. In operation, the chamber manager subroutine 377a selectively schedules or calls the process component subroutines in accordance with the particular process set being executed. The chamber manager subroutine 377a schedules the process component subroutines much like the sequencer subroutine 375 schedules which process chamber 315 and process set are to be executed next. Typically, the chamber manager subroutine 377a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 4. The substrate positioning subroutine 380 comprises program code for controlling chamber components that are used to load the substrate onto pedestal 312 and, optionally, to lift the substrate to a desired height in the chamber 315 to control the spacing between the substrate and the gas distribution manifold 311. When a substrate is loaded into the process chamber 315, pedestal 312 is lowered to receive the substrate, and thereafter, the susceptor 312 is raised to the desired height in the chamber, to maintain the substrate at a first distance or spacing from the gas distribution manifold during the CVD process. In operation, the substrate positioning subroutine 380 controls movement of pedestal 312 in response to process set parameters related to the support height that are transferred from the chamber manager subroutine 377a.

The process gas control subroutine 383 has program code for controlling process gas composition and flow rates. The process gas control subroutine 383 controls the open/close position of the safety shut-off valves, and also ramps up/down the mass flow controllers to obtain the desired gas flow rate. The process gas control subroutine 383 is invoked by the chamber manager subroutine 377a, as are all chamber component subroutines, and receives from the chamber manager subroutine process parameters related to the desired gas flow rates. Typically, the process gas control subroutine 383 operates by opening the gas supply lines and repeatedly (i) reading the necessary mass flow controllers, (ii) comparing the readings to the desired flow rates received from the chamber manager subroutine 377a, and (iii) adjusting the flow rates of the gas supply lines as necessary. Furthermore, the process gas control subroutine 383 includes steps for monitoring the gas flow rates for unsafe rates and for activating the safety shut-off valves when an unsafe condition is detected.

In some processes, an inert gas such as helium or argon is flowed into the chamber 315 to stabilize the pressure in the chamber before reactive process gases are introduced. For these processes, the process gas control subroutine 383 is programmed to include steps for flowing the inert gas into the chamber 315 for an amount of time necessary to stabilize the pressure in the chamber, and then the steps described above would be carried out. Additionally, when a process gas is to be vaporized from a liquid precursor, for example, tetraethylorthosilane ("TEOS"), the A process gas control subroutine 383 is written to include steps for bubbling a delivery gas, such as helium, through the liquid precursor in a bubbler assembly or introducing a carrier gas, such as helium or nitrogen, to a liquid injection system. When a bubbler is used for this type of process, the process gas control subroutine 383 regulates the flow of the delivery gas, the pressure in the bubbler, and the bubbler temperature in order to obtain the desired process gas flow rates. As discussed above, the desired process gas flow rates are transferred to the process gas control subroutine 383 as process parameters. Furthermore, the process gas control subroutine 383 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 385 comprises program code for controlling the pressure in the chamber 315 by regulating the size of the opening of the throttle valve in the exhaust system of the chamber. The size of the opening of the throttle valve is set to control the chamber pressure to the desired level in relation to the total process gas flow, size of the process chamber, and pumping set-point pressure for the exhaust system. When the pressure control subroutine 385 is invoked, the desired, or target, pressure level is received as a parameter from the chamber manager subroutine 377a. The pressure control subroutine 385 operates to measure the pressure in the chamber 315 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 385 can be written to open or close the throttle valve to a particular opening size to regulate the chamber 315 to the desired pressure.

The heater control subroutine 387 comprises program code for controlling the current to a heating unit that is used to heat the substrate 320. The heater control subroutine 387 is also invoked by the chamber manager subroutine 377a and receives a target, or set-point, temperature parameter. The heater control subroutine 387 measures the temperature by measuring voltage output of a thermocouple located in pedestal 312, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 312, the heater control subroutine 387 gradually controls a ramp up/down of current applied to the loop. Additionally, a built-in fail-safe mode can be included to detect process safety compliance, and can shut down operation of the heating unit if the process chamber 315 is not properly set up.

The plasma control subroutine 390 comprises program code for setting the low and high frequency RF power levels applied to the process electrodes in the chamber 315, and for setting the low frequency RF frequency employed. Similar to the previously described chamber component subroutines, the plasma control subroutine 390 is invoked by the chamber manager subroutine 377a.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in pedestal design, heater design, RF power frequencies, location of RF power connections and others are possible. For example, the wafer could be supported by a susceptor and heated by quartz lamps. The layer and method for forming such a layer of the present invention is not limited to any specific apparatus or to any specific plasma excitation method.

III. Deposition of a Low Dielectric Constant IMD Layer

As previously described, the present invention forms a stable, low dielectric constant insulation film using a multistep deposition process. The process is particularly useful for the deposition of intermetal dielectric layers (sometimes referred to as interlevel dielectric layers), especially those used for sub-0.2 micron applications.

Figure 5:
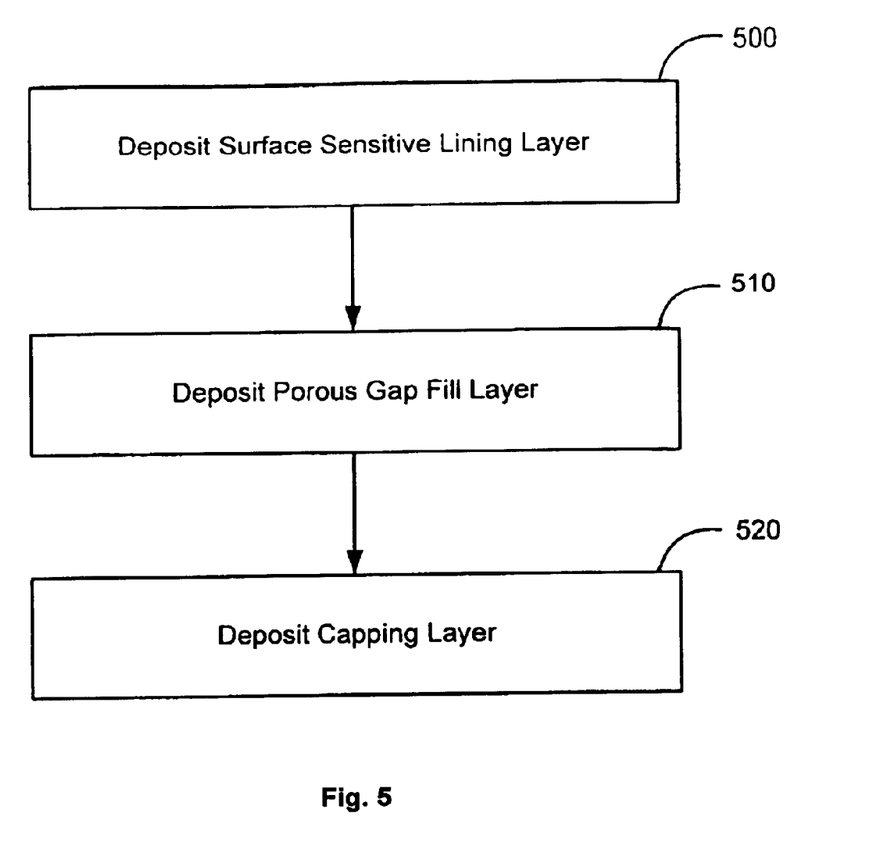
FIG. 5 is a flow chart illustrating process steps in the formation of a multilayer insulation film according to one embodiment of the method of the present invention.

As shown in FIG. 5, which is a flowchart illustrating the process of the present invention, the invention forms a low dielectric constant film by first forming a surface sensitive barrier layer (also referred to as a lining layer) (step 500) and then depositing a porous gap fill layer over the barrier layer (step 510). A third optional capping layer is then deposited over the porous gap fill layer in preferred embodiments to further stabilize the film (step 520).

In one specific and currently preferred embodiment, the surface sensitive lining layer is a TEOS/$O_2$ PECVD layer that is not treated (e.g., plasma treatment with nitrogen, argon, and helium gases) in any manner to reduce the surface sensitivity of the layer. Layer 130 of FIG. 2 is representative of such a PECVD layer. One specific example of depositing the such a PECVD TEOS/$O_2$ film is set forth in Applied Material's Paper, "Surface Related Phenomena in Integrated PECVD/Ozone-TEOS SACVD Processes for Sub-Half Micron Gap Fill: Electrostatic Effect," by K. Kwok, et al., J. Electrochem. Soc., Vol. 141, No. 8, August 1994, pp. 2172–2177 (subsequently referred to as "the Kwok paper"). Typical deposition conditions for a PECVD TEOS/$O_2$ layer (sometimes referred to herein as a "PE-TEOS layers") formed in a DxZ chamber manufactured by Applied Materials and outfitted for 8-inch wafers are set forth in Table I below. It is understood that the values set forth in Table I are for exemplary purposes only. Deposition values outside these ranges may be used in some applications.

TABLE 1

Typical Process Conditions for Deposition of PECVD Lining Layer

| | |
|---|---|
| Pressure | 4–10 Torr |
| Temperature | 300–450° C. |
| High RF Power (13.56 MHz) | 300–800 W |
| Low RF Power (e.g. 350 KHz) | 0–300 W |
| Spacing | 200–400 mils |
| $O_2$ Flow | 400–1000 sccm |
| TEOS Flow | 400–1000 mgm |
| He Flow | 500–1500 sccm |

Furthermore, in other embodiments lining layer 130 is a thermal oxide or other type of surface sensitive oxide film. The primary requirement for lining layer 130 is that it be a surface sensitive layer. In the Kwok paper, a high-ozone TEOS SACVD film was deposited on bare silicon, thermal oxide, and a PE-TEOS oxide underlayer. Surface dependence was measured by four factors: 1) deposition rate, 2) wet etch rate, 3) surface roughness or morphology, and 4) stress hysteresis. Table 2, compares the surface dependent effects for depositing a high ozone SACVD film on three underlying surfaces: bare silicon, thermal oxide and PE-TEOS. The Kwok paper used a process gas having a 12.6:1 molar ratio of ozone to TEOS to deposit the high ozone SACVD film for the tests described in Table 2. The Kwok paper defined a 3.7:1 ratio of ozone to TEOS as a low ozone film and a 5.2 ratio as a medium ozone film. Within the meaning of the present invention, and unless defined otherwise, a high ozone film or film deposited from a process gas having a high ozone to TEOS ratio means the ratio of ozone to TEOS is at least equal to about 8:1. As is described below, however, certain preferred embodiments of the invention employ even higher ozone to TEOS ratios.

Kwok paper, and the PE-TEOS values are estimated from the graphs in FIGS. 1–6 of the Kwok paper.

The Kwok paper considered the thermal oxide and PE-TEOS underlayers to be surface sensitive. Various plasma treatments were then applied to the thermal oxide and PE-TEOS underlayers to reduce surface sensitivity. However, in the specific embodiments of the present invention, the surface sensitivity is not reduced using these or other treatments.

Using the Kwok paper as a basis, a "surface sensitive" silicon oxide layer in the context of the present invention, is interpreted to mean a silicon oxide underlayer having physical characteristics such that when a high ozone TEOS SACVD film as defined in the Kwok paper is deposited over the silicon oxide underlayer the wet etch rate (in a 6:1 BOE solution as understood by those of skill in the art) is greater than about 6000 Å/min. By way of contrast, for example, when such a high ozone TEOS SACVD layer is deposited over an underlayer and has a wet etch rate less than about 3,500 Å/min, the underlayer is not a surface sensitive layer within the meaning of the present invention.

The present invention then deposits a porous silicon oxide layer over the surface sensitive underlayer using a thermal CVD process. In preferred embodiments, the porous silicon oxide layer is deposited from an $O_3$/TEOS process gas using an SACVD deposition process. This deposition process differs from commonly used SACVD $O_3$/TEOS processes in that the deposited layer is significantly more porous than SACVD $O_3$/TEOS layers deposited over non-surface sensitive films. The density of these commonly used SACVD $O_3$/TEOS layers is generally between 2.1–2.2 g/cm$^3$. In contrast, the density of the porous SACVD $O_3$/TEOS layers deposited according to the present invention is between 1.2–1.7 g/cm$^3$. This is an important distinction as the dielectric constant of the silicon oxide film is related to its density. The dielectric constant of the nonporous SACVD $O_3$/TEOS films is generally between 4.2 and 4.4 while the dielectric constant of the porous SACVD $O_3$/TEOS films deposited according to the present invention is between about 2.9 and 3.2.

In addition to depositing the SACVD layer over a surface sensitive layer, the present invention increases the porosity of the layer by using a relatively high ratio of ozone to TEOS. The ozone to TEOS ratio in the process gas is related to the surface sensitivity of the SACVD silicon oxide film.

TABLE 2

Surface Dependence Effects For High Ozone TEOS SACVD Films On Bare Silicon, Thermal Oxide, and PE-TEOS

| | bare silicon[1] | thermal oxide[1] | PE-TEOS[2] |
|---|---|---|---|
| Dep rate | ≥1000 Å/min | 400 Å/min | ~850 Å/min |
| wet etch rate | 5500 Å/min | >>10,000 Å/min | >>10,000 Å/min |
| surface roughness | 4.0 nm | 27 nm | ~23 nm |
| stress hysteresis | 2.0 E8 dynes/cm$^2$ | 5.0 E8 dynes/cm$^2$ | ~5.0 E8 dynes/cm$^2$ |

From Table 2, if the underlayer is thermal oxide then the deposition rate is lower, the wet etch rate is significantly higher, the surface roughness worse, and the stress hysteresis, in a room temperature to 360° C. heat cycle, is higher than an underlayer of bare silicon. With PE-TEOS as an underlayer, the effects were in between, with the wet etch rate, surface roughness, and stress hysteresis being relatively close to the thermal oxide values. In Table 2, the bare silicon values and thermal oxide values are from Table IV of the Films deposited from a high ratio process gas are more surface sensitive than films deposited from a low ratio process gas. In one specific embodiment a 12.5 wt. % ozone in $O_2$ gas is flowed at 5000 sccm and mixed with a 350 mgm flow of TEOS. This provides a molar ratio of 11.56:1 $O_3$ to TEOS. Generally, it is preferred that the molar ratio of $O_3$ to TEOS be between 10:1 and 20:1 and it is even more preferred that the ratio be at least 11.5:1.

In the past, porous SACVD oxide layers have been thought to be undesirable because the layers are generally unstable and have a tendency to absorb moisture. Such moisture absorbtion raises the dielectric constant of the layer and can result in outgassing and other problems during subsequent processing. The present inventors determined that the stability of the porous SACVD layer could be increased by incorporating a sufficient amount of carbon in the film. Prior art SACVD $O_3$/TEOS layers generally have a carbon content of between 2–3 at. %. The porous SACVD $O_3$/TEOS layer of the present invention, however, has a significantly higher amount of carbon, at least 5 at. %, incorporated into the layer. Preferred emnbodiments of the invention have been between 7–8 at. % carbon incorporated into the layer. The upper limit of the amount of carbon incorporated into the film is limited by the process gas. It is believed that having TEOS as the source of carbon limits the amount of carbon incorporated into the oxide film to a maximum of about 10 at. %.

The method of the present invention achieves a high carbon content in the film by (1) using a relatively high ozone to TEOS ratio and (2) depositing the layer at a reduced temperature, The inventors have found that it is important to use a deposition temperature below 400° C. in order to incorporate a sufficient amount of carbon into the film to obtain a stable layer. It is preferred that the deposition temperature of the SACVD $O_3$TEOS layer be between 200–400° C. and in a currently preferred embodiment it is preferred that the deposition temperature be about 380° C.

The deposition pressure can be between 1–760 Torr. In preferred embodiments, however, deposition process parameters for the porous oxide layer are in the SACVD regime and include a pressure between about 100 to 700 Torr. In one particular SACVD deposition process, deposition conditions include a helium flow rate of about 3000 to 7000 sccm, an ozone flow rate of 12.5 wt. % of about 5000 sccm, a TEOS flow rate of about 350 mgm. In other embodiments nitrogen is used as the TEOS carrier gas instead of helium. It is believed that nitrogen further enhances the surface sensitivity of the film.

In some preferred embodiments a thin PE-TEOS oxide layer (136 in FIG. 2) is then deposited over the SACVD gap fill layer (133 in FIG. 2) using a process similar to the process described above with respect to the PE-TEOS barrier layer. Preferably, lining layer 130, gap fill layer 133 and capping layer 136 are all deposited in a single chamber in an in situ process.

IV. Expertments and Test Results

To show the effectiveness of the present invention, experiments were performed depositing the PE-TEOS barrier layer followed by the SACVD TEOS/$O_3$ gap fill layer. The experiments were performed in a DxZ chamber manufactured by Applied Materials. The DxZ chamber was outfitted for 200-mm wafers and situated in a P5000 substrate processing system also manufactured by Applied Materials.

In these experiments, a 4000 Å SACVD $O_3$/TEOS gap fill layer was deposited over a 1000 Å surface sensitive PE-TEOS barrier layer. The deposition temperature was 400° C. and the deposition pressure was 700 Torr. TEOS was introduced at a rate of 320 mgm, vaporized in a liquid injection system as known to those of skill in the art and mixed with helium carrier gas flow of 4000 sccm. A 12.5 wt. % $O_3$ gas flow was also introduced at a rate of 5000 sccm. A capping layer was not deposited over the SACVD layer.

The above deposition conditions resulted in the deposition of a porous silicon oxide film over the barrier layer. The density of the film was 1.7 g/cm$^3$ and the dielectric constant, "k", was about 3.0. The wafers were then left in the clean room ambient for four weeks and afterwards the dielectric constant was measured again. No change in the dielectric constant was detected.

The gas flow rates recited and described above are optimized for deposition processes run in a DxZ chamber manufactured by Applied Materials and outfitted for 200 mm wafers. A person of ordinary skill in the art will recognize that the rates at which various precursor gases in the process gas are introduced are in part chamber specific and will vary if chambers of other design and/or volume are employed.

Having fully described several embodiments of the present invention, many other equivalent or alternative methods of depositing the low dielectric constant oxide layer according to the present invention will be apparent to those skilled in the art. For example, while the present application showed the invention used as an IMD layer having vias etched therein, the layer may also be used in damascene layers that are included in some integrated circuits. These alternatives and equivalents are intended to be included within the scope of the present invention.

What is claimed is:

1. A method for forming an insulation layer over a substrate, the method comprising:

forming a surface sensitive silicon oxide layer over the substrate; and forming a porous silicon oxide layer on the surface sensitive silicon oxide layer by thermal chemical vapor deposition, wherein said porous silicon oxide layer is deposited at a temperature of about 400° C. or less, the porous silicon oxide layer having a density of less than or equal to about 1.7 g/cm$^3$;

wherein the porous silicon oxide layer has a wet etch rate of greater than about 6000 Å/min.

2. The method of claim 1 wherein the porous silicon oxide layer has a carbon content of at least 5 atomic percent.

3. The method of claim 1 wherein the porous silicon oxide layer has a dielectric constant of between about 2.9 and 3.2.

4. The method of claim 1 wherein the surface sensitive silicon oxide layer is deposited from a plasma enhanced CVD reaction of TEOS and oxygen.

5. The method of claim 1 wherein the porous silicon oxide layer is deposited from a process gas comprising TEOS and ozone.

6. The method of claim 5 wherein a molar ratio of said TEOS to ozone is between about 10:1 and 20:1.

7. The method of claim 1 further comprising forming a capping silicon oxide layer over the porous silicon oxide layer.

8. The process of claim 1 wherein said porous silicon oxide layer is deposited using an SACVD process at a pressure of between 100–700 Torr.

9. The method of claim 1 wherein said surface sensitive and porous silicon oxide layers are deposited in an in situ process.

10. A method for depositing an intermetal dielectric film over a plurality of conductive lines, the method comprising:

depositing a plasma enhanced chemical vapor deposition (CVD) silicon oxide layer over the plurality of conductive lines from a plasma of tetraethyloxysilane (TEOS) and oxygen; and depositing a silicon oxide layer over the plasma enhanced CVD silicon oxide layer by a thermal CVD process from a gas mixture of a TEOS and ozone wherein said thermal silicon oxide layer has a dielectric constant of about 3.2 or less and a carbon content of at least about 5 atomic percent.

11. The method of claim 10 wherein the density of said thermal silicon oxide layer is less than or equal to about 1.7 g/cm$^3$.

12. The method of claim 10 further comprising depositing a plasma enhanced CVD silicon oxide capping layer over the thermal silicon oxide layer.

13. The method of claim 10 wherein the dielectric constant of said thermal silicon oxide layer is greater than or equal to about 2.9.

14. The method of claim 10 wherein a molar ratio of said TEOS and ozone used to deposit said thermal silicon oxide layer is at least 8:1.

15. The method of claim 6 wherein said molar ratio is at least about 11.5:1.

16. The method of claim 14 wherein said molar ratio is between about 10:1 and 20:1.

17. The method of claim 10 wherein said oxygen is provided from a flow of molecular oxygen.

18. The method of claim 10 wherein said plasma enhanced and thermal CVD silicon oxide layers are deposited in an in situ process.

19. The process of claim 10 wherein said thermal silicon oxide layer is deposited using an SACVD process at a pressure of between 100–700 Torr.

20. The method of claim 10 wherein the plasma enhanced CVD silicon oxide layer partially fills gaps between the plurality of conductive lines.

21. The method of claim 20 wherein the thermal silicon oxide layer fills the gaps between the plurality of conductive lines.

22. The method of claim 1 wherein the substrate includes at least one gap, and wherein the surface sensitive silicon oxide layer partially fills the at least one gap.

23. The method of claim 22 wherein the porous silicon oxide layer fills the at least one gap.

24. A method for forming an insulation layer over a substrate having at least one gap, the method comprising:

forming a surface sensitive silicon oxide layer as a lining layer over the substrate having the at least one gap; and forming a porous silicon oxide layer on the surface sensitive silicon oxide layer by thermal chemical vapor deposition, wherein said porous silicon oxide layer is deposited at a temperature of about 400° C. or less, the porous silicon oxide layer having a density of less than or equal to about 1.7 g/cm$^3$;

wherein the porous silicon oxide layer has a wet etch rate of greater than about 6000 Å/min.

25. The method of claim 24 wherein the porous silicon oxide layer fills the at least one gap.

* * * * *